(12) United States Patent
Chiba

(10) Patent No.: US 6,412,099 B1
(45) Date of Patent: Jun. 25, 2002

(54) APPARATUS AND METHOD FOR CONVERTING LOGICAL CONNECTION INFORMATION OF CIRCUIT

(75) Inventor: Kazuki Chiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/531,832

(22) Filed: Mar. 21, 2000

(30) Foreign Application Priority Data

Mar. 25, 1999 (JP) .......................................... 11-082018

(51) Int. Cl.[7] .................................................. G06F 9/45
(52) U.S. Cl. ............................................. 716/6; 716/12
(58) Field of Search ............................. 716/1–7, 10–13, 716/18, 8–9, 14–17; 713/401, 500, 503; 703/19

(56) References Cited

U.S. PATENT DOCUMENTS

| | | | | |
|---|---|---|---|---|
| 5,864,487 A | * | 1/1999 | Merryman et al. ............. | 716/6 |
| 6,053,950 A | * | 4/2000 | Shinagawa .................... | 703/19 |
| 6,073,246 A | * | 6/2000 | Song et al. ................... | 713/401 |
| 6,260,181 B1 | * | 7/2001 | Inoue ............................ | 716/10 |
| 6,305,001 B1 | * | 10/2001 | Graef .......................... | 716/12 |

FOREIGN PATENT DOCUMENTS

JP          10-171550          6/1998

* cited by examiner

Primary Examiner—Matthew Smith
Assistant Examiner—Paul Dinh
(74) Attorney, Agent, or Firm—Scully, Scott, Murphy & Presser

(57) ABSTRACT

Specific sequence circuit element detector 4 detects each sequential circuit element having a clock control terminal connected to an output node of a clock tree synthesis and an output terminal connected, directly or via a combinational circuit element, to one of output terminals designated by output terminal list 3 from logical connection information 1 and logical element library 2. Clock signal replacer 5 replaces the output node of the clock tree synthesis connected to the clock control terminal by an input node of the clock tree synthesis and generates logical connection information 6 logically equivalent to logical connection information 1.

6 Claims, 8 Drawing Sheets

FIG. 3

EXAMPLE OF OUTPUT TERMINAL LIST

8 —
```
OUT 11
  .
  .
  .
OUT 1m
OUT 21
  .
  .
  .
OUT 2n
```

FIG. 6

EXAMPLE OF OUTPUT TERMINAL LIST

9 —
| | |
|---|---|
| OUT 11 | 1ns |
| . | . |
| . | . |
| . | . |
| OUT 1m | 1ns |
| OUT 21 | 2ns |
| . | . |
| . | . |
| . | . |
| OUT 2n | 2ns |

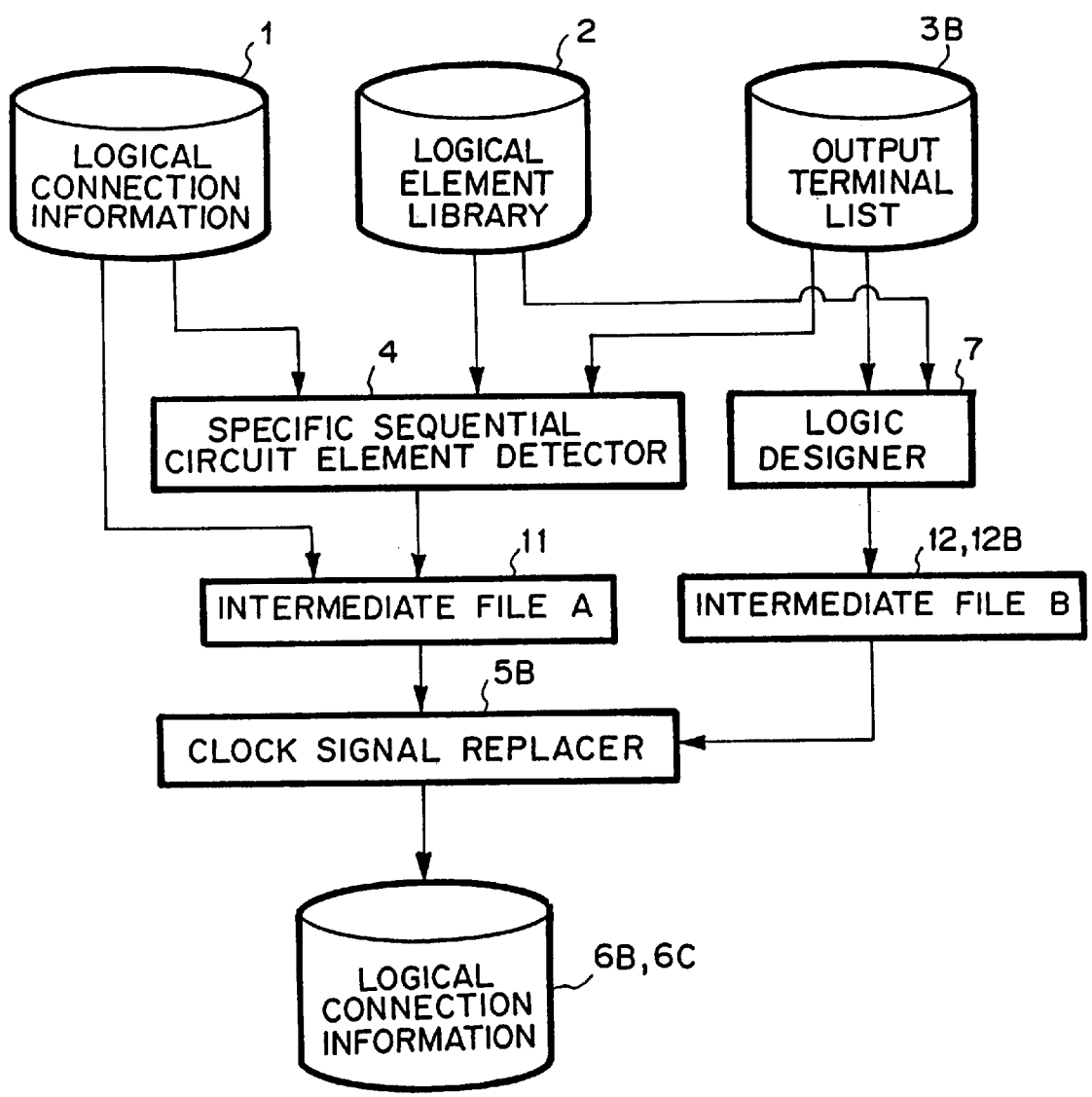

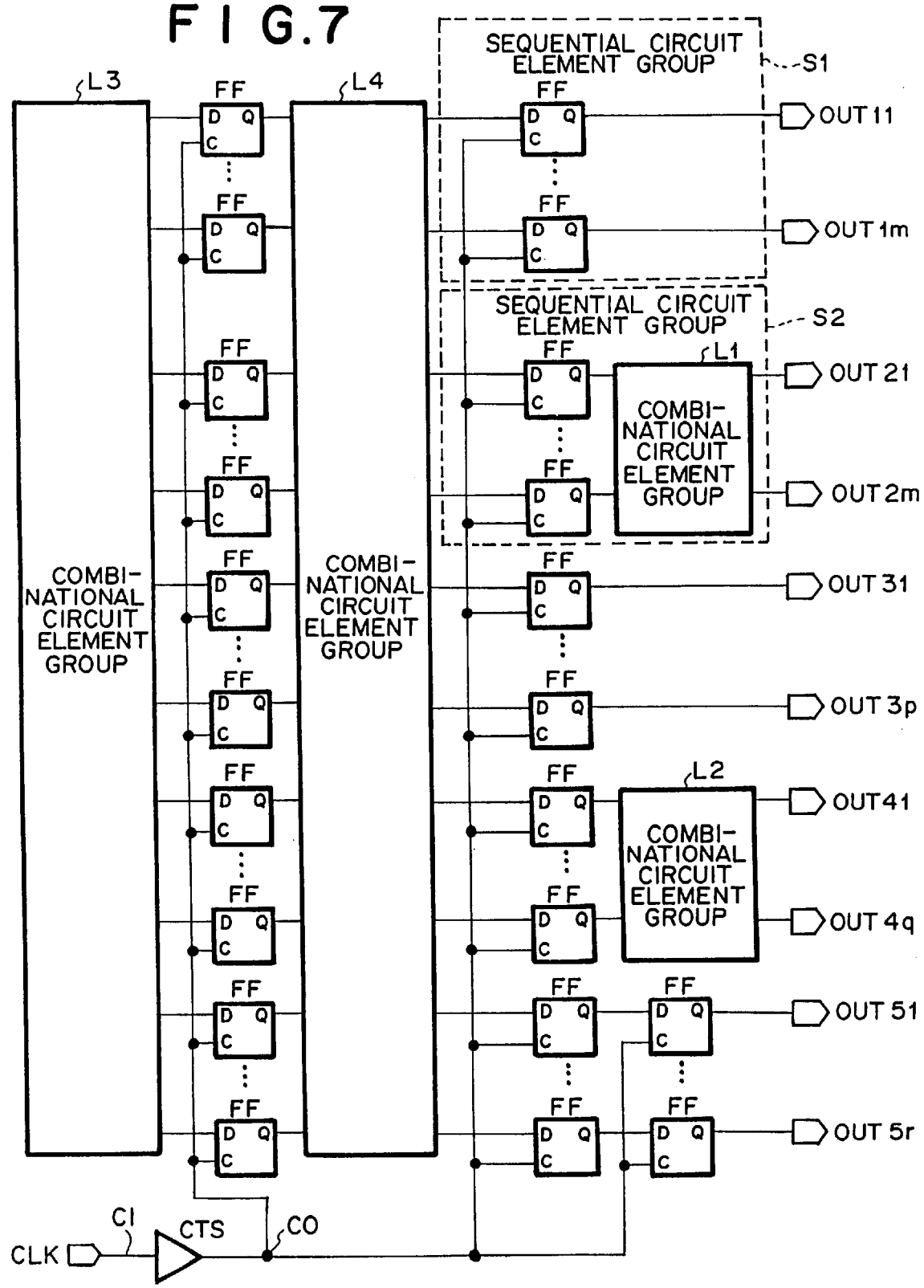

APPARATUS AND METHOD FOR CONVERTING LOGICAL CONNECTION INFORMATION OF CIRCUIT

BACKGROUND OF THE INVENTION

1. Field of the Invention

The present invention relates to an apparatus and method for designing a circuit comprising a clock tree synthesis (hereinafter, referred to as CTS) and in particular, to an apparatus and method for converting logical connection information of a circuit comprising a clock tree synthesis.

2. Description of the Prior Art

A prior art will be explained with reference to FIG. 7 showing a conventional circuit comprising a CTS, FIG. 8 showing a general structure of a CTS, and FIG. 9 showing a conventional circuit comprising a CTS and a PLL (Phase-Locked Loop).

In the area of designing a synchronous circuit, it is common to adopt a CTS in order to reduce clock skews which are time differences among delays from a clock signal inputted to a primary clock terminal CLK to a clock signals supplied to clock terminals C of flip-flops of sequential circuits.

Referring to FIG. 8, a CTS is composed of a plurality of buffers B which are connected in tree configuration by serial-parallel connection. A clock signal supplied to a terminal CI is outputted from terminals CO while keeping the same logical level. At the stage of designing a layout of an LSI, in order to reduce clock skews, locations of buffers B, the length of each line between buffers B, and the length of each line between each buffer B and each flip-flop of each sequential circuit are finely adjusted.

Although a CTS has an advantage that the CTS can reduce clock skews, the CTS has a disadvantage that propagation delay time thereof is long because clock signals pass through multistage buffers B.

There is a method for shortening the propagation delay times of a CTS by combining a PLL with the CTS as shown in FIG. 9. According to this method, the phase of clocks supplied to flip-flops of sequential circuits coincide with the phase of a clock CLKO presenting on an output node of clock terminal CLK by feeding back one of the clocks supplied to the flip-flops to the PLL. Thus, propagation delay time in the PLL and the CTS substantially becomes zero.

In the prior art as shown in FIG. 7, because the propagation delay times in CTS are long, a period from a time when a clock signal at clock terminal CLK changes to a time when an output signal from an output terminal for synchronization output (hereinafter, referred to as clock synchronous output terminal) changes becomes long. Therefore, it is difficult to make the period satisfy a desired standard.

The reason why the propagation delay time in a CTS is long is as explained above. That is, the reason is that a clock signal inputted to node CI passes through multistage buffers B which are in serial-parallel connection in the CTS to output from node CO as shown in FIG. 8.

In the case of combining a PLL with a CTS as shown in FIG. 9, because a propagation delay time in the PLL and the CTS is substantially zero, it is easy to make an output delay time at a clock synchronous output terminal satisfy a desired standard. However, a problem arises that the area of an LSI chip increases due to the introduction of the PLL. In addition, another problem arises that a clock which coincides in phase with a clock at terminal CLK do not present at node CO in a state of clock halt or at the beginning of operation because the PLL has a minimum operation frequency to operate normally. The latter problem renders the inner state of the LSI not ensured.

According to a standard of PCI (Personal Computer Interface) which is adopted as a standard local bus of personal computers, the maximum output delay time is strictly limited and the inner state of LSIs must be ensured in a state of clock halt and at the beginning of operation. Therefore, the method of combining a PLL with a CTS hardly meets the standard of PCI.

SUMMARY OF THE INVENTION

In order to overcome the aforementioned disadvantages, the present invention has been made and accordingly, has an object to provide an apparatus for converting logical connection information of a circuit which apparatus makes an LSI chip ensured in inner state in a state of clock halt and at the beginning of operation, not increased in area, and shortened in output delay time at clock synchronous output terminals.

According to a first aspect of the present invention, there is provided an apparatus for converting logical connection information of a circuit comprising a clock tree synthesis, the apparatus comprising: a specific sequential circuit element detector which inputs first logical connection information in which connections among logical elements are described, a logical element library in which information as to whether each logical element is a sequential circuit element or a combinational circuit, information as to whether each terminal of each logical element is an input terminal or an output terminal, and information as to whether each terminal is a clock control terminal or not are included, and an output terminal list in which specific output terminals are described, and detects sequential circuit elements by using the first logical connection information, the logical element library, and the output terminal list, each of which has a clock control terminal connected to an output node of the clock tree synthesis, and an output terminal which is, directly or via a combinational circuit, connected to one of the specific output terminals; and a clock signal replacer which replaces an output node of the clock synthesis tree which is connected to the clock control terminal of each of the detected sequential circuit elements by an input node of the clock synthesis tree, and outputs second logical connection information of the circuit which is logically equivalent to the first logical connection information of the circuit.

According to a second aspect of the present invention, there is provided an apparatus for converting logical connection information of a circuit comprising a clock tree synthesis, the apparatus comprising: a specific sequential circuit element detector which inputs first logical connection information in which connections among logical elements are described, a logical element library in which information as to whether each logical element is a sequential circuit element or a combinational circuit, information as to whether each terminal of each logical element is an input terminal or an output terminal, and information as to whether each terminal is a clock control terminal or not are included, and an output terminal list in which specific output terminals and a period for each of the specific output terminals are described, and detects sequential circuit elements by using the first logical connection information, the logical element library, and the output terminal list, each of which has a clock control terminal connected to an output node of the clock tree synthesis, and an output terminal which is, directly or via a combinational circuit, connected to one of the specific output terminals; a logic designer which designs a logical element composed of a part of logical elements in the logical element library, an output node of the logical element being logically identical with an output node of the clock tree synthesis, and a delay time of the logical element from an input node of the clock tree synthesis being shorter than the clock tree synthesis's propagation delay time by the period of each of the specific output terminals; and a clock signal replacer which replaces an output node of the clock synthesis tree which is connected to the clock control terminal of each of the detected sequential circuit elements by the output node of the logical element designed by the logic designer, and outputs second logical connection information of the circuit which is logically equivalent to the first logical connection information of the circuit.

According to a third aspect of the present invention, there is provided an apparatus for converting logical connection information of a circuit comprising a clock tree synthesis, the apparatus comprising: a specific sequential circuit element detector which inputs first logical connection information in which connections among logical elements are described, a logical element library in which information as to whether each logical element is a sequential circuit element or a combinational circuit, information as to whether each terminal of each logical element is an input terminal or an output terminal, and information as to whether each terminal is a clock control terminal or not are included, and an output terminal list in which specific output terminals and a period for each of the specific output terminals are described, and detects sequential circuit elements by using the first logical connection information, the logical element library, and the output terminal list, each of which has a clock control terminal connected to an output node of the clock tree synthesis, and an output terminal which is, directly or via a combinational circuit, connected to one of the specific output terminals; a logic designer which designs a logical element composed of a part of logical elements in the logical element library, an output node of the logical element being logically identical with an output node of the clock tree synthesis, and a delay time of the logical element from an input node of the clock tree synthesis being the same as the period of each of the specific output terminals; and a clock signal replacer which replaces an output node of the clock synthesis tree which is connected to the clock control terminal of each of the detected sequential circuit elements by the output node of the logical element designed by the logic designer, and outputs second logical connection information of the circuit which is logically equivalent to the first logical connection information of the circuit.

These and other objects, features and advantages of the present invention will become more apparent in the light of the following detailed description of the best mode embodiments thereof, as illustrated in the accompanying drawings.

BRIEF DESCRIPTION OF THE DRAWINGS

FIG. 3 shows an example of contents of output terminal list as shown in FIG. 1;

FIG. 4 is a block diagram showing an apparatus for converting logical connection information of a circuit according to a second and third embodiments of the present invention;

FIG. 6 shows an example of contents of output terminal list as shown in FIG. 4;

FIG. 7 shows a circuit before conversion by the apparatus for converting logical connection information of a circuit according to the first, second, and third embodiments of the present invention;

DETAILED DESCRIPTION OF THE PREFERRED EMBODIMENT

Preferred modes of embodiment according to the present invention will be described with reference to the accompanying drawings.

[Embodiment 1]

Figure 1:
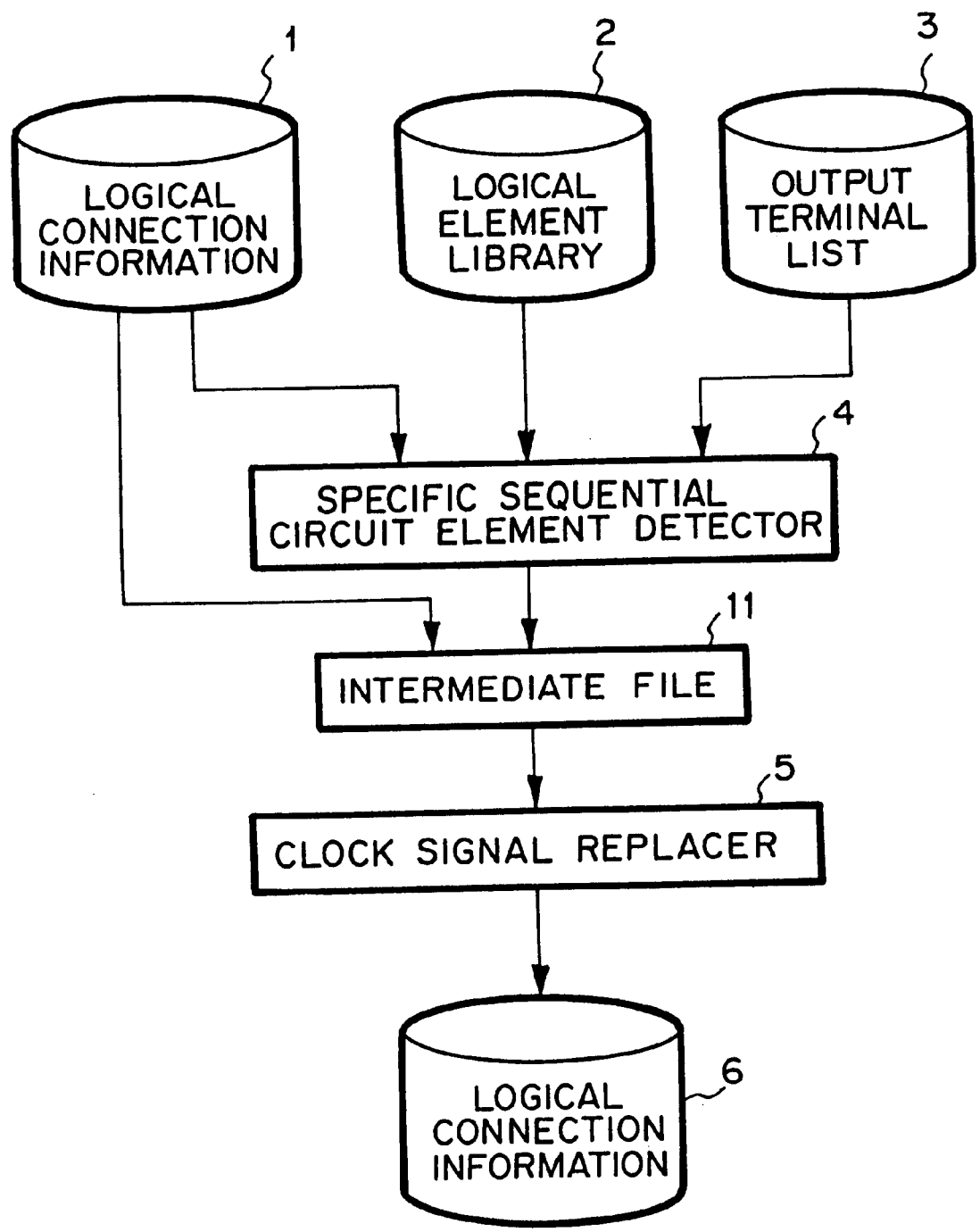
FIG. 1 is a block diagram showing an apparatus for converting logical connection information of a circuit according to a first embodiment of the present invention.

The structure of the apparatus for converting logical connection information of a circuit according to the first embodiment of the present invention will be explained with reference to FIG. 1 showing the structure of the apparatus.

Referring to FIG. 1, the apparatus comprises specific sequential circuit element detector 4, and clock signal replacer 5. Specific sequential circuit element detector 4 inputs logical connection information 1, logical element library 2, and output terminal list 3, detects specific sequential circuit elements, and outputs intermediate file 11. Clock signal replacer 5 inputs logical connection information 1 and intermediate file 11, replaces output nodes of a CTS connected with clock control terminals of the specific sequential circuit elements by other logical nodes, and outputs logical connection information 6 which is logically equivalent to logical connection information 1.

Figure 2:
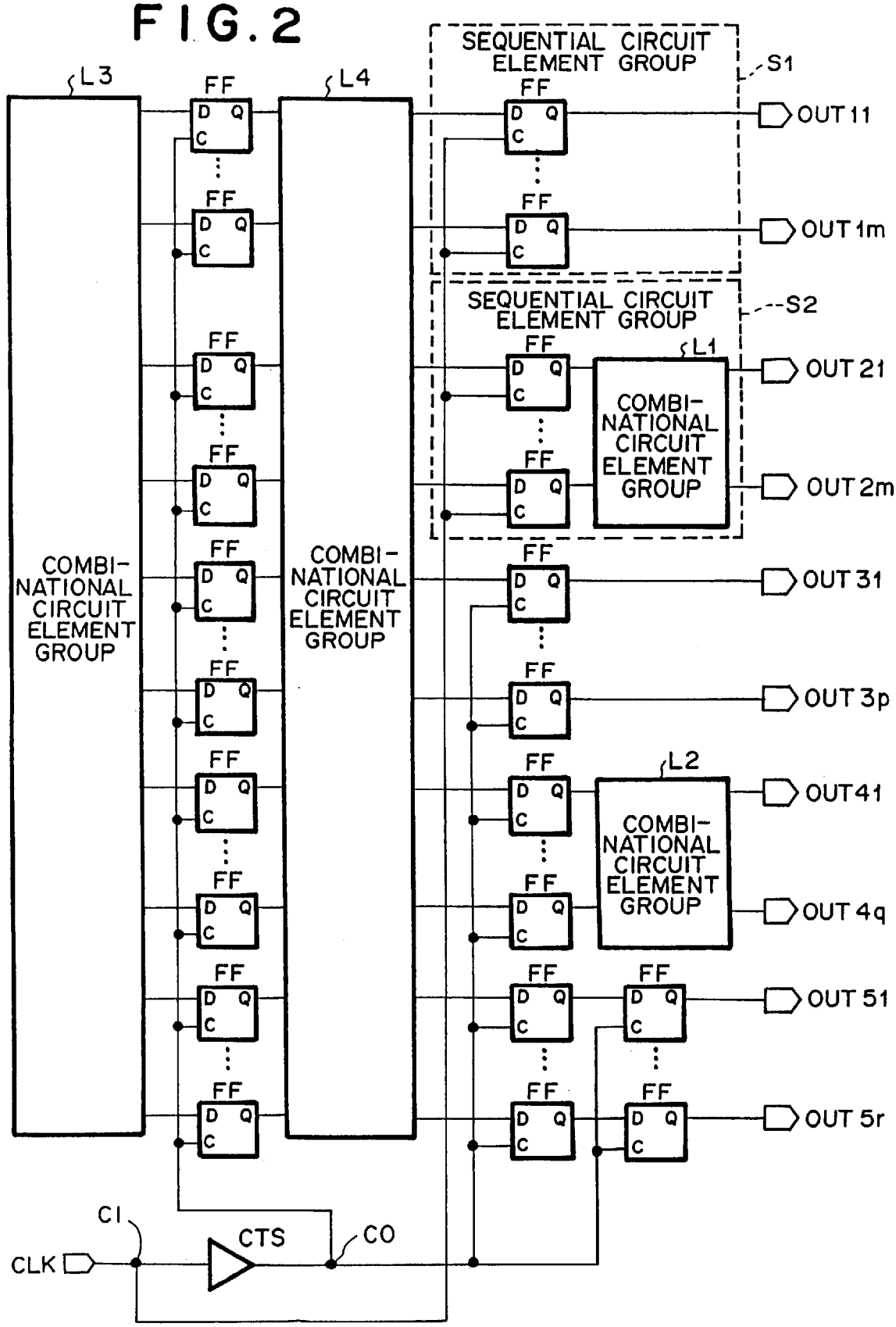
FIG. 2 is shows a circuit after conversion by the apparatus for converting logical connection information of a circuit according to the first embodiment of the present invention.

The operation of the apparatus for converting logical connection information of a circuit according to the first embodiment of the present invention will be explained with reference to FIG. 1 showing the structure of the apparatus, FIG. 2 showing a circuit reflecting logical connection information after conversion by the apparatus, FIG. 3 showing an example of contents of output terminal list 3, and FIG. 7 showing a circuit reflecting logical connection information before conversion by the apparatus.

Explanation will be made on an example that the conversion by the apparatus is applied to logical connection information reflected to the circuit as shown in FIG. 7.

The apparatus inputs logical connection information 1, logical element library 2, and output terminal list 3, and outputs logical connection information 6 as shown in FIG. 1.

Logical connection information 1 is contained in a file referred to as a net list and describes inner logical connections of an LSI comprising a CTS.

Logical element library 2 contains information to discriminate input/output attribute of each terminal of each logical element constituting logical connection information 1, information as to whether each logical element is a sequential circuit element or a combinational circuit element, and information as to whether each terminal of each sequential circuit element is clock control terminal or not.

In output terminal list 3, there are beforehand written output terminals which are desired to be shortened in output delay time among all the output terminals of an LSI as shown, for example, in FIG. 3 which shows that OUT11 . . . OUT1m, and OUT21 . . . OUT2n are the output terminals which are desired to be shortened in output delay time.

Specific sequential circuit element detector 4 detects each sequential circuit element whose output terminal is directly connected with any of the output terminals specified by output terminal list 3 and each sequential circuit element whose output terminal is connected with another of the output terminals specified by output terminal list 3 via only a combinational circuit element among all the sequential circuit elements whose clock control terminal C is connected with output node C of the CTS. Specific sequential circuit element detector 4 outputs intermediate file 11 in which the instance names of the detected sequential elements are written.

The detailed operation of specific sequential circuit element detector 4 will be explained as follows:

Detector 4 traces back logical elements in a sequence of an output→an input→an output→an input . . . starting from each of output terminals specified by output terminal list 3, e.g. OUT11 . . . OUT1m, and OUT21 . . . OUT2n, on the basis of input/output attributes, which is written in logical element library 2, of each terminal of each logical element in logical connection information 1. If detector 4 detects a sequential circuit element during the trace back, then detector 4 completes the trace back for the corresponding path. If detector 4 detects a branch of a path, then detector 4 executes trace back for all the paths from the branch. After completing a trace back for a path, detector 4 investigates whether the corresponding sequential circuit element's clock control terminal C is connected to output node CO of the CTS or not, and if it is, detector 4 temporally stores the instance name of the sequential circuit element. The above operation is repeated for all the clock synchronous output terminals specified by output terminal list 3. After completing the repetition, detector 4 outputs intermediate file 11 in which all the temporally stored instance names are recorded.

An example of the operation of specific sequential circuit element detector 4 will be explained with reference to FIG. 7 as follows:

Output terminals of sequential circuit elements in sequential circuit element group S1 are directly connected with clock synchronous output terminals OUT11 . . . OUT1m which are specified by output terminal list 3. In addition, clock control terminals C of the sequential circuit elements in sequential circuit element group S1 are connected with output nodes CO of the CTS. Therefore, detector 4 temporally stores instance names of the sequential circuit elements in sequential circuit element group S1.

Output terminals of sequential circuit elements in sequential circuit element group S2 are, via combinational circuit element group L1, connected with clock synchronous output terminals OUT21 . . . OUT2m which are specified by output terminal list 3. In addition, clock control terminals C of the sequential circuit elements in sequential circuit element group S2 are connected with output nodes CO of the CTS. Therefore, detector 4 temporally stores instance names of the sequential circuit elements in sequential circuit element group S2.

As to the other sequential circuit elements, the above conditions are not satisfied and the instance names thereof are not temporally stored.

Thus, intermediate file 11 includes only the instance names of the sequential circuit elements in sequential circuit element groups S1 and S2.

Next, the operation of clock signal replacer 5 will be explained in detail as follows:

Clock signal replacer 5 inputs logical connection information 1 and intermediate file 11, replaces output nodes CO of the CTS connected with clock control terminals C of the specific sequential circuit elements in sequential circuit element groups S1 and S2 by input nodes CI of the CTS, and outputs logical connection information 6.

Logical connection information 6 differs from logical connection information 1 only in that clock sources to clock control terminals of the specific sequential circuit elements in sequential circuit element groups S1 and S2 are changed from output nodes CO of the CTS to input nodes CI of the CTS, which is apparent from comparison of FIG. 2 with FIG. 7. Logical connection information 6 is logically equivalent to logical connection information 1.

The apparatus for converting logical connection information of a circuit according to the first embodiment of the present invention takes effect that each output delay time at each of the clock synchronous output terminals specified by output terminal list 3 is shortened by a propagation delay time in the CTS.

[Embodiment 2]

The apparatus for converting logical connection information of a circuit according to the second embodiment of the present invention will be explained with reference to FIG. 4 showing the structure thereof.

Referring to FIG. 4, the apparatus comprises specific sequential circuit element detector 4, clock signal replacer 5, and logic designer 7. Specific sequential circuit element detector 4 inputs logical connection information 1, logical element library 2, and output terminal list 3B, detects specific sequential circuit elements, and outputs intermediate file A 11. Logic designer 7 inputs logical element library 2, and output terminal list 3B, designs logical nodes which are logically equivalent to the output nodes of the CTS, and outputs intermediate file B 12. Clock signal replacer 5B inputs logical connection information 1, intermediate file A 11, and intermediate file B 12, replaces output nodes of a CTS connected with clock control terminals of the specific sequential circuit elements by other logical nodes designed by logic designer 7, and outputs logical connection information 6B which is logically equivalent to logical connection information 1.

Figure 5:
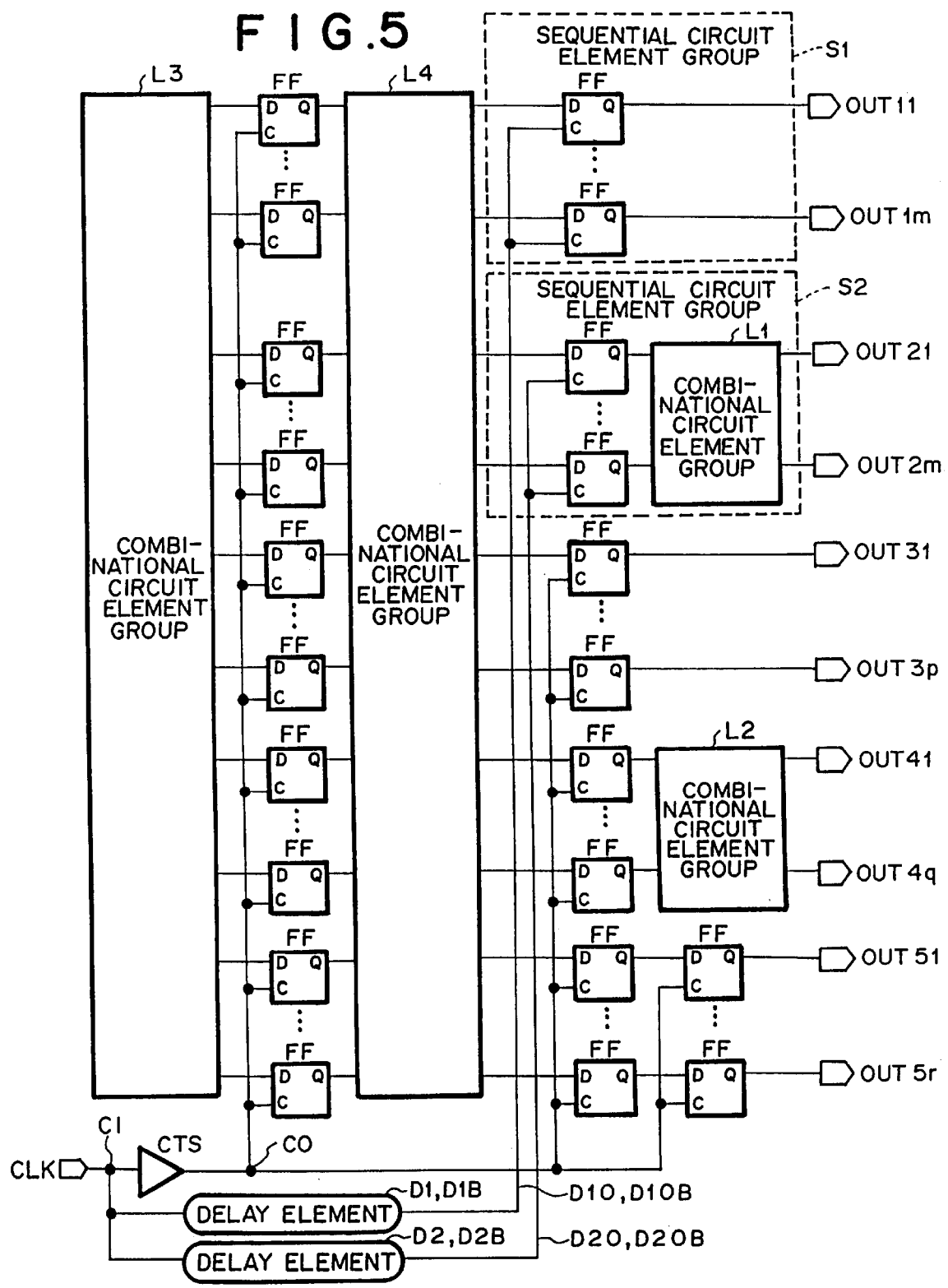
FIG. 5 shows a circuit after conversion by the apparatus for converting logical connection information of a circuit according to the second and third embodiments of the present invention.
Figure 8:
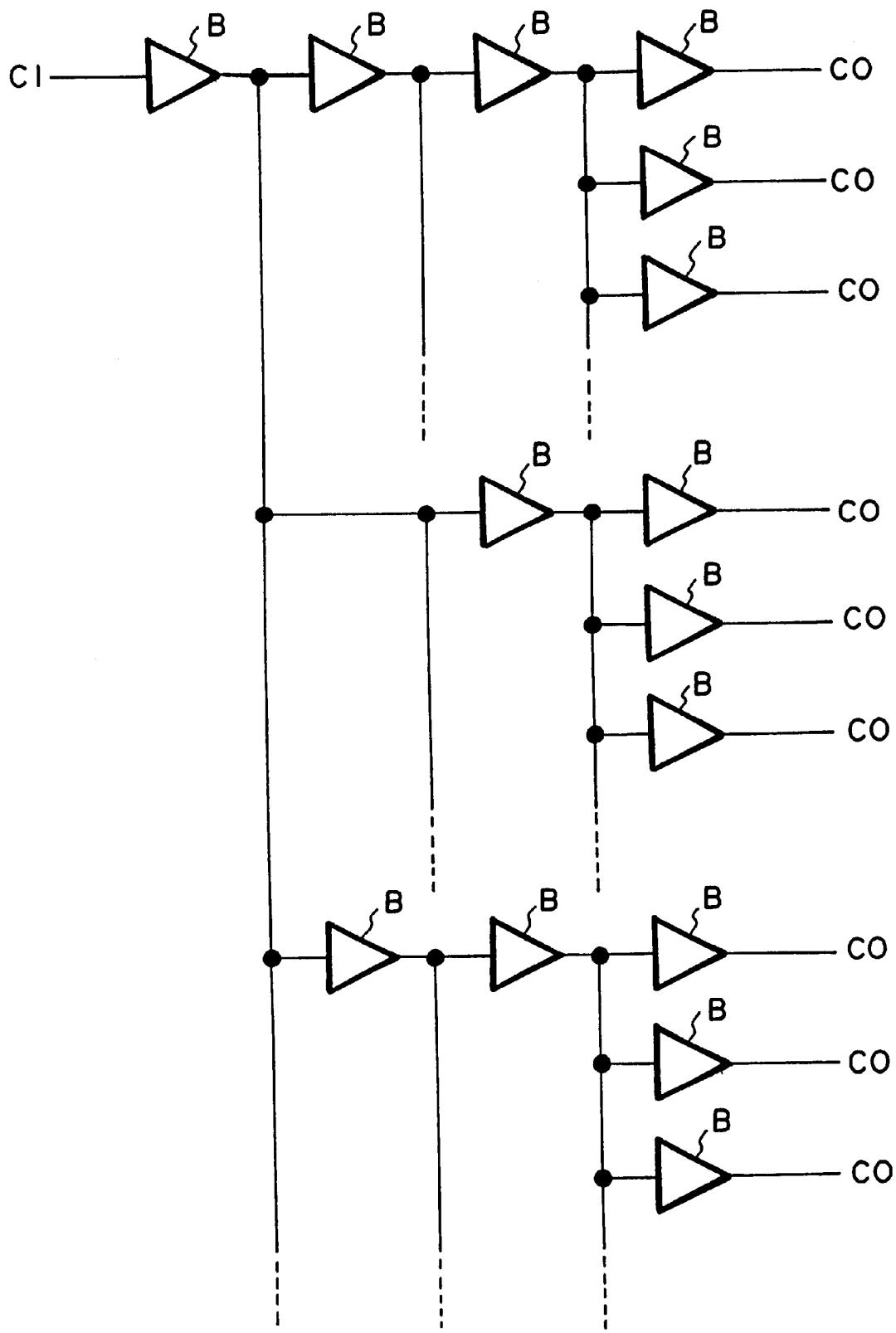
FIG. 8 is a circuit diagram showing the structure of a CTS.
Figure 9:
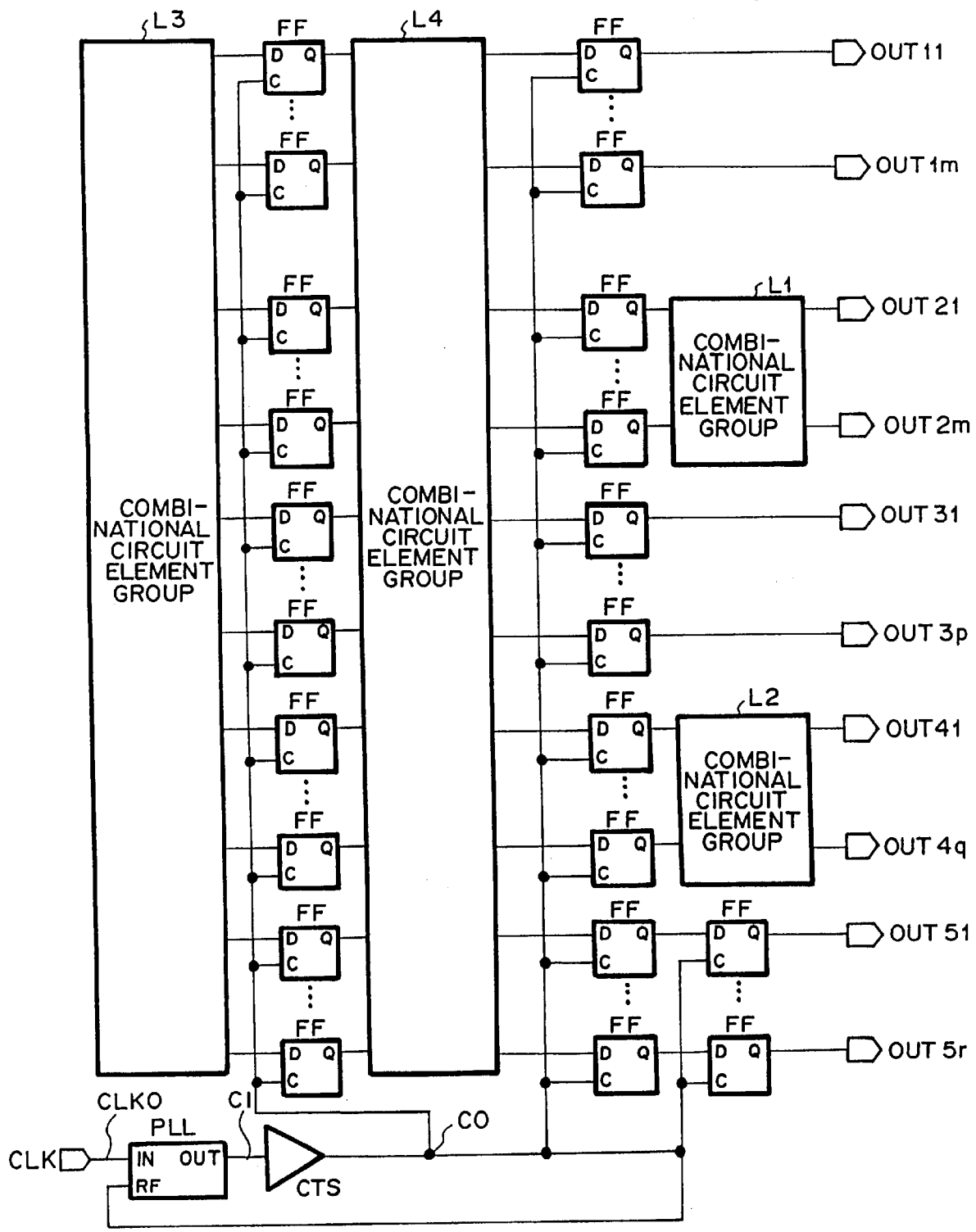
FIG. 9 shows a circuit in which a CTS and a PLL are included.

The operation of the apparatus for converting logical connection information of a circuit according to the second embodiment of the present invention will be explained with reference to FIG. 4 showing the structure of the apparatus, FIG. 5 showing a circuit reflecting logical connection information after conversion by the apparatus, FIG. 6 showing an example of contents of output terminal list 3B, and FIG. 7 showing a circuit reflecting logical connection information before conversion by the apparatus.

Explanation will be made on an example that the conversion by the apparatus is applied to logical connection information reflected to the circuit as shown in FIG. 7.

The apparatus inputs logical connection information 1, logical element library 2, and output terminal list 3B, and outputs logical connection information 6B as shown in FIG. 4.

Logical connection information 1 is contained in a file referred to as a net list and describes inner logical connections of an LS1 comprising a CTS.

Logical element library 2 contains information to discriminate input/output attribute of each terminal of each logical element constituting logical connection information 1, information as to whether each logical element is a sequential circuit element or a combinational circuit element, and information as to whether each terminal of each sequential circuit element is clock control terminal or not.

In output terminal list 3B, there are beforehand written output terminals which are desired to be shortened in output delay time among all the output terminals of an LSI as shown, for example, in FIG. 6 which shows that OUT11 . . . OUT1m, and OUT21 . . . OUT2n are the output terminals which are desired to be shortened in output delay time by 1 nsec and 2 nsec, respectively. The decrease of the output delay time are shorter than the propagation delay time of the CTS shown in FIG. 7. That is, the relation that the propagation delay time of the CTS is longer than 2 nsec is a premise.

The operation of specific sequential circuit element detector 4 in which it inputs logical connection information 1, logical element library 2, and output terminal list 3B, detects specific sequential circuit elements, and outputs the instance names of the specific sequential circuit elements is the same as the first embodiment.

Logic designer 7 designs logical nodes which are composed of a part of logical elements defined in logical element library 2 and logically the same as output nodes CO of the CTS and whose propagation delay times are shorter than the propagation delay time of the CTS by periods designated by output terminal list 3B, and logic designer 7 outputs intermediate file B 12 in which the designed logical nodes are recorded. If the propagation delay time of the CTS is 5 nsec, then, in the example as shown in FIG. 6, as the decreases of the output delay times are 1 nsec, and 2 nsec, logic designer 7 designs node D1 whose propagation delay time is 4 nsec (=5 nsec−1 nsec), and node D2 whose propagation delay time is 3 nsec (=5 nsec−2 nsec) as shown in FIG. 5.

Clock signal replacer 5 inputs logical connection information 1, intermediate file A 11, and intermediate file B 12, replaces the output nodes CO of the CTS which are connected to clock control terminals C of sequential circuit elements recorded in intermediate file A 11 by logical nodes D1O, and D2O, and outputs logical connection information 6B which reflects the replacement.

The circuit corresponding to logical connection information 6 is different from the circuit corresponding to logical connection information 1 only in that the nodes CO which are connected with the clock control terminals of sequential circuit element groups S1 and S2 are replace by logical nodes D1O and D2O which are designed by logic designer 7. Logical connection information 6B is logically the same as logical connection information 1. FIG. 5 shows the circuit which corresponds to logical connection information 6B.

Referring to FIG. 5, logical node D1O designed by logic designer 7 is such a node that outputs a clock signal which is delayed by 4 nsec from the clock inputted to input node CI of the CTS by delay element D1. The output node CO of the CTS which is connected with clock control terminals C of sequential circuit elements in sequential circuit element group S1 is replace by logical node D1O.

Logical node D2O designed by logic designer 7 is such a node that outputs a clock signal which is delayed by 3 nsec from the clock inputted to input node CI of the CTS by delay element D2. The output node CO of the CTS which is connected with clock control terminals C of sequential circuit elements in sequential circuit element group S2 is replace by logical node D2O.

The apparatus for converting logical connection information of a circuit according to the second embodiment of the present invention takes effect that each output delay time at each of the clock synchronous output terminals specified by output terminal list 3B is shortened by a delay time specified by output terminal list 3B.

[Embodiment 3]

The apparatus for converting logical connection information of a circuit according to the third embodiment is the same as that according to the second embodiment in structure, and the explanation thereof is omitted.

The operation of the apparatus for converting logical connection information of a circuit according to the third embodiment of the present invention will be explained with reference to FIG. 4 showing the structure of the apparatus, FIG. 5 showing a circuit reflecting logical connection information after conversion by the apparatus, FIG. 6 showing an example of contents of output terminal list 3B, and FIG. 7 showing a circuit reflecting logical connection information before conversion by the apparatus.

Explanation will be made on an example that the conversion by the apparatus is applied to logical connection information reflected to the circuit as shown in FIG. 7.

The apparatus inputs logical connection information 1, logical element library 2, and output terminal list 3B, and outputs logical connection information 6C as shown in FIG. 4.

Logical connection information 1 and logical element library 2 are the same as those of the second embodiment.

In output terminal list 3B, there are beforehand written output terminals which are desired to be shortened in output delay time among all the output terminals of an LSI as shown, for example, in FIG. 6 which shows that OUT11 . . . OUT1m, and OUT21 . . . OUT2n are the output terminals which are desired to be shortened in output delay time by 4 nsec (5 nsec−1 nsec) and 3 nsec (5 nsec−2 nsec), respectively, provided that the propagation delay time of the CTS is 5 nsec. The decrease of the output delay time are shorter than the propagation delay time of the CTS shown in FIG. 7. That is, the relation that the propagation delay time of the CTS is longer than 3 nsec is a premise.

The operation of specific sequential circuit element detector 4 in which it inputs logical connection information 1, logical element library 2, and output terminal list 3B, detects specific sequential circuit elements, and outputs the instance names of the specific sequential circuit elements is the same as the first and second embodiments.

Logic designer 7 designs logical nodes which are composed of a part of logical elements defined in logical element library 2 and logically the same as output nodes CO of the CTS and whose propagation delay times from input nodes CI of the CTS are the same as the periods designated by output terminal list 3B, and logic designer 7 outputs intermediate file B 12B in which the designed logical nodes are recorded. If the propagation delay time of the CTS is 5 nsec, then, in the example as shown in FIG. 6, as the output delay times are 1 nsec, and 2 nsec, logic designer 7 designs node D1 whose propagation delay time is 1 nsec, and node D2 whose propagation delay time is 2 nsec as shown in FIG. 5.

Clock signal replacer 5 inputs logical connection information 1, intermediate file A 11, and intermediate file B 12B, replaces the output nodes CO of the CTS which are connected to clock control terminals C of sequential circuit elements recorded in intermediate file A 11 by logical nodes D1OB, and D2OB, and outputs logical connection information 6C which reflects the replacement.

The circuit corresponding to logical connection information 6C is different from the circuit corresponding to logical connection information 1 only in that the nodes CO which are connected with the clock control terminals of sequential circuit element groups S1 and S2 are replace by logical nodes D1OB and D2OB which are designed by logic designer 7. Logical connection information 6C is logically the same as logical connection information 1. FIG. 5 shows the circuit which corresponds to logical connection information 6C.

Referring to FIG. 5, logical node D1OB designed by logic designer 7 is such a node that outputs a clock signal which is delayed by 1 nsec from the clock inputted to input node CI of the CTS by delay element D1B. The output node CO of the CTS which is connected with clock control terminals C of sequential circuit elements in sequential circuit element group S1 is replace by logical node D1OB.

Logical node D2OB designed by logic designer 7 is such a node that outputs a clock signal which is delayed by 2 nsec from the clock inputted to input node CI of the CTS by delay element D2B. The output node CO of the CTS which is connected with clock control terminals C of sequential circuit elements in sequential circuit element group S2 is replace by logical node D2OB.

The apparatus for converting logical connection information of a circuit according to the third embodiment of the present invention takes effect that each output delay time at each of the clock synchronous output terminals specified by output terminal list 3B is shortened to a delay time specified by output terminal list 3B.

As explained above, the present invention takes an effect that the output delay times of specified clock synchronous output terminals can be shortened while insuring the inner state of an LSI in a state of clock halt and at the beginning of clock operation without increasing the area of the LSI because a circuit which affects the minimum operation frequency and the chip area such as a PLL is not added and the present invention provides logical connection information which realizes to advance a clock supplied to only a specific sequential circuit element group.

The present invention is effective in designing a circuit which is ensured in internal states in clock halt state or at the beginning of a clock operation, of which output delay time is strictly restricted, and of which the maximum operation frequency is not high. That is, the present invention is effective in designing, for example, a circuit which conforms with PCI bus standard.

Although the present invention has been shown and explained with respect to the best mode embodiments thereof, it should be understood by those skilled in the art that the foregoing and various other changes, omissions, and additions in the form and detail thereof may be made therein without departing from the spirit and scope of the present invention.

What is claimed is:

1. An apparatus for converting logical connection information of a circuit comprising a clock tree synthesis, said apparatus comprising:

a specific sequential circuit element detector which inputs first logical connection information in which connections among logical elements are described, a logical element library in which information as to whether each logical element is a sequential circuit element or a combinational circuit, information as to whether each terminal of each logical element is an input terminal or an output terminal, and information as to whether each terminal is a clock control terminal or not are included, and an output terminal list in which specific output terminals are described, and detects sequential circuit elements by using said first logical connection information, said logical element library, and said output terminal list, each of which has a clock control terminal connected to an output node of said clock tree synthesis, and an output terminal which is, directly or via a combinational circuit, connected to one of said specific output terminals; and a clock signal replacer which replaces an output node of said clock synthesis tree which is connected to the clock control terminal of each of the detected sequential circuit elements by an input node of said clock synthesis tree, and outputs second logical connection information of the circuit which is logically equivalent to said first logical connection information of the circuit.

2. An apparatus for converting logical connection information of a circuit comprising a clock tree synthesis, said apparatus comprising:

a specific sequential circuit element detector which inputs first logical connection information in which connections among logical elements are described, a logical element library in which information as to whether each logical element is a sequential circuit element or a combinational circuit, information as to whether each terminal of each logical element is an input terminal or an output terminal, and information as to whether each terminal is a clock control terminal or not are included, and an output terminal list in which specific output terminals and a period for each of said specific output terminals are described, and detects sequential circuit elements by using said first logical connection information, said logical element library, and said output terminal list, each of which has a clock control terminal connected to an output node of said clock tree synthesis, and an output terminal which is, directly or via a combinational circuit, connected to one of said specific output terminals;

a logic designer which designs a logical element composed of a part of logical elements in said logical element library, an output node of said logical element being logically identical with an output node of the clock tree synthesis, and a delay time of said logical element from an input node of the clock tree synthesis being shorter than the clock tree synthesis's propagation delay time by the period of each of the specific output terminals; and a clock signal replacer which replaces an output node of said clock synthesis tree which is connected to the clock control terminal of each of the detected sequential circuit elements by the output node of said logical element designed by said logic designer, and outputs second logical connection information of the circuit which is logically equivalent to said first logical connection information of the circuit.

3. An apparatus for converting logical connection information of a circuit comprising a clock tree synthesis, said apparatus comprising:

a specific sequential circuit element detector which inputs first logical connection information in which connections among logical elements are described, a logical element library in which information as to whether each logical element is a sequential circuit element or a combinational circuit, information as to whether each terminal of each logical element is an input terminal or an output terminal, and information as to whether each terminal is a clock control terminal or not are included, and an output terminal list in which specific output terminals and a period for each of said specific output terminals are described, and detects sequential circuit elements by using said first logical connection information, said logical element library, and said output terminal list, each of which has a clock control terminal connected to an output node of said clock tree synthesis, and an output terminal which is, directly or via a combinational circuit, connected to one of said specific output terminals;

a logic designer which designs a logical element composed of a part of logical elements in said logical element library, an output node of said logical element being logically identical with an output node of the clock tree synthesis, and a delay time of said logical element from an input node of the clock tree synthesis being the same as the period of each of the specific output terminals; and a clock signal replacer which replaces an output node of said clock synthesis tree which is connected to the clock control terminal of each of the detected sequential circuit elements by the output node of said logical element designed by said logic designer, and outputs second logical connection information of the circuit which is logically equivalent to said first logical connection information of the circuit.

4. A method for converting logical connection information of a circuit comprising a clock tree synthesis, said method comprising steps of:

inputting first logical connection information in which connections among logical elements are described;

inputting a logical element library in which information as to whether each logical element is a sequential circuit element or a combinational circuit, information as to whether each terminal of each logical element is an input terminal or an output terminal, and information as to whether each terminal is a clock control terminal or not are included;

inputting an output terminal list in which specific output terminals are described;

detecting sequential circuit elements by using said first logical connection information, said logical element library, and said output terminal list, each of which has a clock control terminal connected to an output node of said clock tree synthesis, and an output terminal which is, directly or via a combinational circuit, connected to one of said specific output terminals;

replacing an output node of said clock synthesis tree which is connected to the clock control terminal of each of the detected sequential circuit elements by an input node of said clock synthesis tree, and outputting second logical connection information of the circuit which is logically equivalent to said first logical connection information of the circuit.

5. A method for converting logical connection information of a circuit comprising a clock tree synthesis, said method comprising steps of:

inputting first logical connection information in which connections among logical elements are described;

inputting a logical element library in which information as to whether each logical element is a sequential circuit element or a combinational circuit, information as to whether each terminal of each logical element is an input terminal or an output terminal, and information as to whether each terminal is a clock control terminal or not are included;

inputting an output terminal list in which specific output terminals and a period for each of said specific output terminals are described;

detecting sequential circuit elements by using said first logical connection information, said logical element library, and said output terminal list, each of which has a clock control terminal connected to an output node of said clock tree synthesis, and an output terminal which is, directly or via a combinational circuit, connected to one of said specific output terminals;

designing a logical element composed of a part of logical elements in said logical element library, an output node of said logical element being logically identical with an output node of the clock tree synthesis, and a delay time of said logical element from an input node of the clock tree synthesis being shorter than the clock tree synthesis's propagation delay time by the period of each of the specific output terminals;

replacing an output node of said clock synthesis tree which is connected to the clock control terminal of each of the detected sequential circuit elements by the output node of said logical element designed by said logic designer; and outputting second logical connection information of the circuit which is logically equivalent to said first logical connection information of the circuit.

6. A method for converting logical connection information of a circuit comprising a clock tree synthesis, said method comprising steps of:

inputting first logical connection information in which connections among logical elements are described;

inputting a logical element library in which information as to whether each logical element is a sequential circuit element or a combinational circuit, information as to whether each terminal of each logical element is an input terminal or an output terminal, and information as to whether each terminal is a clock control terminal or not are included;

inputting an output terminal list in which specific output terminals and a period for each of said specific output terminals are described, and detects sequential circuit elements by using said first logical connection information, said logical element library, and said output terminal list, each of which has a clock control terminal connected to an output node of said clock tree synthesis, and an output terminal which is, directly or via a combinational circuit, connected to one of said specific output terminals;

designing a logical element composed of a part of logical elements in said logical element library, an output node of said logical element being logically identical with an output node of the clock tree synthesis, and a delay time of said logical element from an input node of the clock tree synthesis being the same as the period of each of the specific output terminals; and replacing an output node of said clock synthesis tree which is connected to the clock control terminal of each of the detected sequential circuit elements by the output node of said logical element designed by said logic designer; and outputting second logical connection information of the circuit which is logically equivalent to said first logical connection information of the circuit.

* * * * *